United States Patent
Kanno et al.

(10) Patent No.: US 10,981,524 B2
(45) Date of Patent: Apr. 20, 2021

(54) ELECTRONIC CONTROL UNIT

(71) Applicant: HITACHI AUTOMOTIVE SYSTEMS, LTD., Hitachinaka (JP)

(72) Inventors: Hiroshi Kanno, Hitachinaka (JP);
Hiroshi Usami, Hitachinaka (JP);
Yasuhiko Nagata, Hitachinaka (JP);
Masataka Ota, Hitachinaka (JP);
Katsunori Yamashita, Hitachinaka (JP)

(73) Assignee: HITACHI AUTOMOTIVE SYSTEMS, LTD., Hitachinaka (JP)

( * ) Notice: Subject to any disclaimer, the term of this patent is extended or adjusted under 35 U.S.C. 154(b) by 0 days.

(21) Appl. No.: 16/307,480

(22) PCT Filed: Jun. 12, 2017

(86) PCT No.: PCT/JP2017/021575
§ 371 (c)(1),
(2) Date: Dec. 5, 2018

(87) PCT Pub. No.: WO2018/012168
PCT Pub. Date: Jan. 18, 2018

(65) Prior Publication Data
US 2019/0176726 A1 Jun. 13, 2019

(30) Foreign Application Priority Data
Jul. 13, 2016 (JP) .............................. JP2016-138716

(51) Int. Cl.
*B60R 16/02* (2006.01)
*B60R 16/023* (2006.01)
*H03K 17/567* (2006.01)

(52) U.S. Cl.
CPC .......... *B60R 16/0231* (2013.01); *B60R 16/02* (2013.01); *H03K 17/567* (2013.01)

(58) Field of Classification Search
CPC .... B60R 16/0231; B60R 16/02; H03K 17/567
See application file for complete search history.

(56) References Cited

U.S. PATENT DOCUMENTS

2004/0207377 A1    10/2004  Shimada et al.
2014/0003103 A1*   1/2014   Aaltio .................... H02M 1/32
                                                     363/56.03
(Continued)

FOREIGN PATENT DOCUMENTS

JP    H08-047249 A    2/1996
JP    2000-016196 A   1/2000
(Continued)

*Primary Examiner* — Jung Kim
(74) *Attorney, Agent, or Firm* — Foley & Lardner LLP

(57) ABSTRACT

Provided is an electric control unit which is configured to switch the functions of an LCC, an HSD, and an LSD depending on a load to be connected. A power-supply-side switching element 102 is provided in a path L1 between a power supply 401 and a connector terminal 301. A ground-side switching element 106 is provided in a path L2 between a ground 402 and a connector terminal 302. A freewheeling diode 105 is provided in a path L3 connected to a connection point P1 between the power-supply-side switching element 102 and the connector terminal 301 and a connection point P2 between the ground-side switching element 106 and the connector terminal 302. A switching element 104 is provided in the path L3.

10 Claims, 11 Drawing Sheets

(56) References Cited

U.S. PATENT DOCUMENTS

2015/0155275 A1* 6/2015 Bahramian ......... H01L 21/8258
  257/76
2016/0059807 A1 3/2016 Iwasaki et al.

FOREIGN PATENT DOCUMENTS

| JP | 2004-311856 A | 11/2004 |
| JP | 2007-258392 | 10/2007 |
| JP | 2009-240027 A | 10/2009 |
| JP | 2016-043872 A | 4/2016 |

* cited by examiner

ELECTRONIC CONTROL UNIT

TECHNICAL FIELD

The present invention relates to an electronic control unit.

BACKGROUND ART

In order to use an automobile electronic control unit (ECU) for general purposes, it is necessary to prepare interface circuits which correspond to various types of vehicles. Here, the interface circuits include a load driving circuit, such as a linear current control circuit (hereinafter referred to as LCC), a low-side on/off control circuit (hereinafter referred to as LSD), and a high-side on/off control circuit (hereinafter referred to as HSD).

However, as various interface circuits are held, the number of connector terminals of the ECU increases and the size of the ECU increases. The ECU has been requested to reduce the size and cost thereof. Thus, there is a demand for an interface circuit which changes a driving form according to a load to be connected.

In contrast, there is known a device having the functions of an LCC and an HSD and capable of switching these functions (for example, see PTL 1). In PTL 1 (FIGS. 3 to 6), the LCC and the HSD are selectively used for the same load connection.

CITATION LIST

Patent Literature

PTL 1: JP 2007-258392 A

SUMMARY OF INVENTION

Technical Problem

The device disclosed in PTL 1 does not correspond to the LSD and does not have a function as the LSD.

An object of the present invention is to provide an electronic control unit which is configured to switch the functions of an LCC, an HSD, and an LSD depending on a load to be connected.

Solution to Problem

In order to achieve the above object, the present invention includes a first switching element provided in a first path between a power supply and a first terminal, a second switching element provided in a second path between a ground and a second terminal, a rectifier element provided in a third path connected to a first connection point between the first switching element and the first terminal and a second connection point between the second switching element and the second terminal, and a third switching element provided in the third path.

Advantageous Effects of Invention

According to the present invention, the functions of the LCC, the HSD, and the LSD can be switched depending on a load to be connected. Problems, configurations, and effects other than those in the above description will be made clear in the following description of the embodiments.

DESCRIPTION OF EMBODIMENTS

Figure 1:
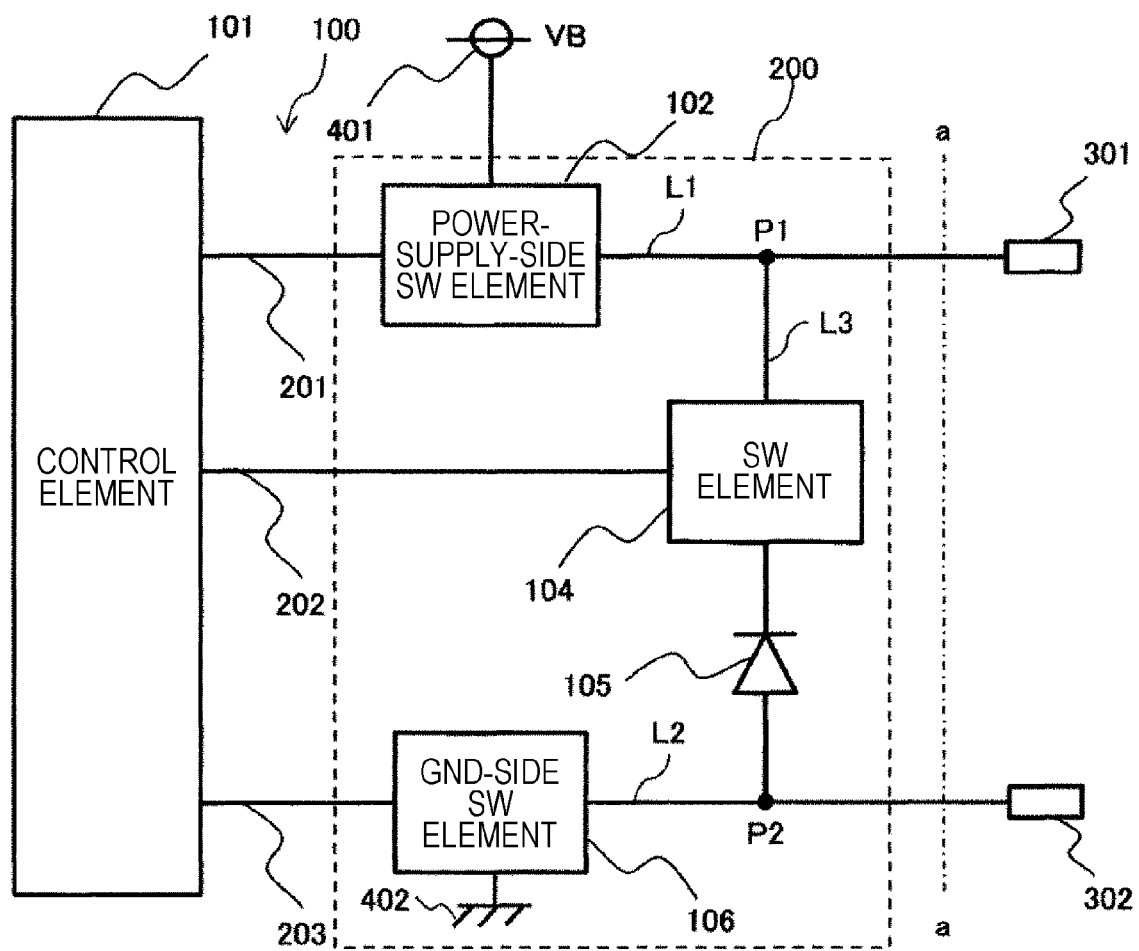
FIG. 1 is a schematic diagram of an electronic control unit including an interface circuit according to a first embodiment of the present invention.

Hereinafter, the configurations and operations of an electronic control unit including an interface circuit will be described according to first to third embodiments of the present invention, with reference to the drawings. In each figure, the same reference numerals denote the same portions.

First Embodiment

Hereinafter, a first embodiment of the present invention will be described with reference to FIG. 1. FIG. 1 is a diagram illustrating a basic circuit configuration of the electronic control unit 100 including the interface circuit 200 according to the first embodiment of the present invention.

A power-supply-side switching element 102 (first switching element) is provided in a path L1 (first path) between a power supply 401 (battery) and a connector terminal 301 (first terminal). A ground-side switching element 106 (second switching element) is provided in a path L2 (second path) between a ground 402 and a connector terminal 302 (second terminal). A freewheeling diode 105 (rectifier element) is provided in a path L3 (third path) connected to a connection point P1 (first connection point) between the power-supply-side switching element 102 and the connector terminal 301 and a connection point P2 (second connection point) between the ground-side switching element 106 and the connector terminal 302. A switching element 104 (third switching element) is provided in the path L3.

A control element 101, such as a microcomputer or an IC, controls the power-supply-side switching element 102, the switching element 104 on a current return path, and the ground-side switching element 106.

Figure 1A:
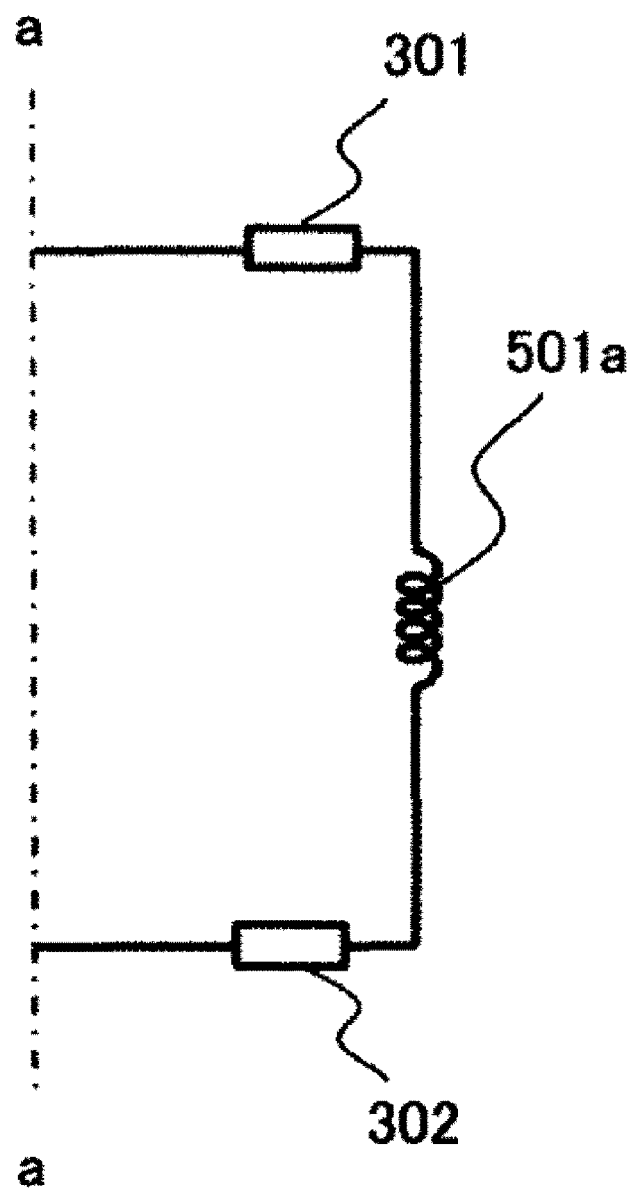
FIG. 1A is a diagram illustrating connection of a load for an LCC.

When the interface circuit is used as an LCC, an inductive load 501a is connected as illustrated in FIG. 1A. That is, one end of the inductive load 501a is connected to the connector terminal 301 (first terminal), and the other end of the inductive load 501a is connected to the connector terminal 302 (second terminal). The control element 101 causes the switching element 104 (third switching element) on the current return path to be always turned on (kept on) by using a control signal line 202 to conduct a return current through the freewheeling diode 105. The control element 101 drives the inductive load 501a for LCC connected to the connector terminals 301 and 302 by switching the power-supply-side switching element 102 by using the control signal line 201 or switching the ground-side switching element 106 by using the control signal line 203, and the power-supply-side switching element or the ground-side switching element on which control of switching is not performed is always on.

Figure 1B:
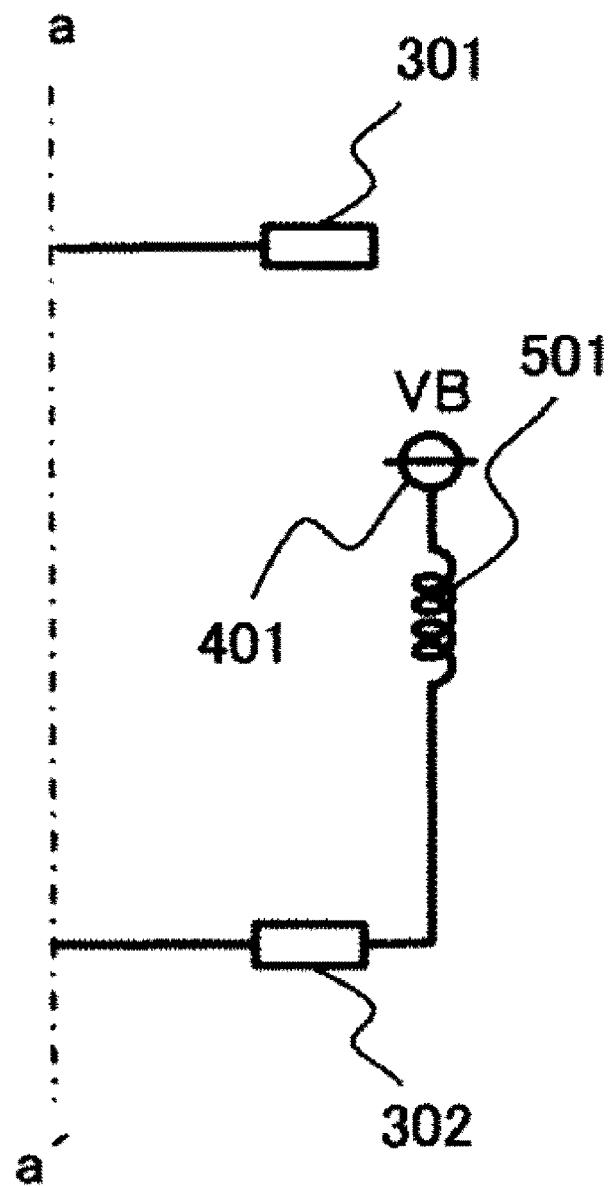
FIG. 1B is a diagram illustrating connection of a load for an LSD.

As illustrated in FIG. 1B, when the interface circuit is used as an LSD, a load 501 (specifically, a resistive load, an inductive load, a capacitive load, etc.) is connected. That is, in an example illustrated in FIG. 1B, one end of the load 501 is connected only to the connector terminal 302 (the second terminal). The other end of the load 501 is connected to the power supply 401. The control element 101 causes the power-supply-side switching element 102 (first switching element) to be always turned off by using the control signal line 201, and the switching element 104 (third switching element) on the current return path to be always turned off by using the control signal line 202 (keeps the power-supply-side switching element 102 and the switching element 104 off) so that switching of the ground-side switching element 106 (second switching element) by using the control signal line 203 drives the load 501 for an LSD connected to the connector terminal 302.

Figure 1C:
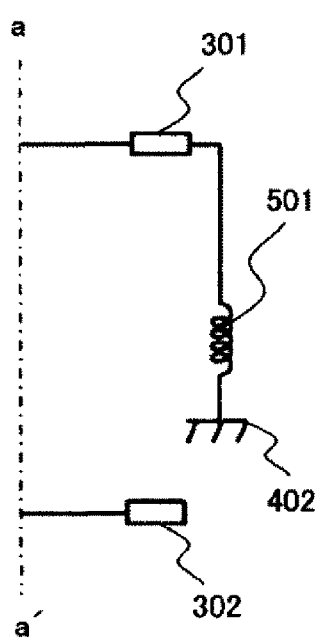
FIG. 1C is a diagram illustrating connection of a load for an HSD.

As illustrated in FIG. 1C, when the interface circuit is used as an HSD, a load 501 (specifically, a resistive load, an inductive load, a capacitive load, etc.) is connected. That is, in an example illustrated in FIG. 1C, one end of the load 501 is connected only to the connector terminal 301 (first terminal). The other end of the load 501 is connected to the ground 402. The control element 101 always turns off the ground-side switching element 106 through the control signal line 203 and the switching element 104 on the current return path through the control signal line 202, and causes the load 501 for an HSD connected to the connector terminal 301 to drive by switching the power-supply-side switching element 102 through the control signal line 201.

Figure 1D:
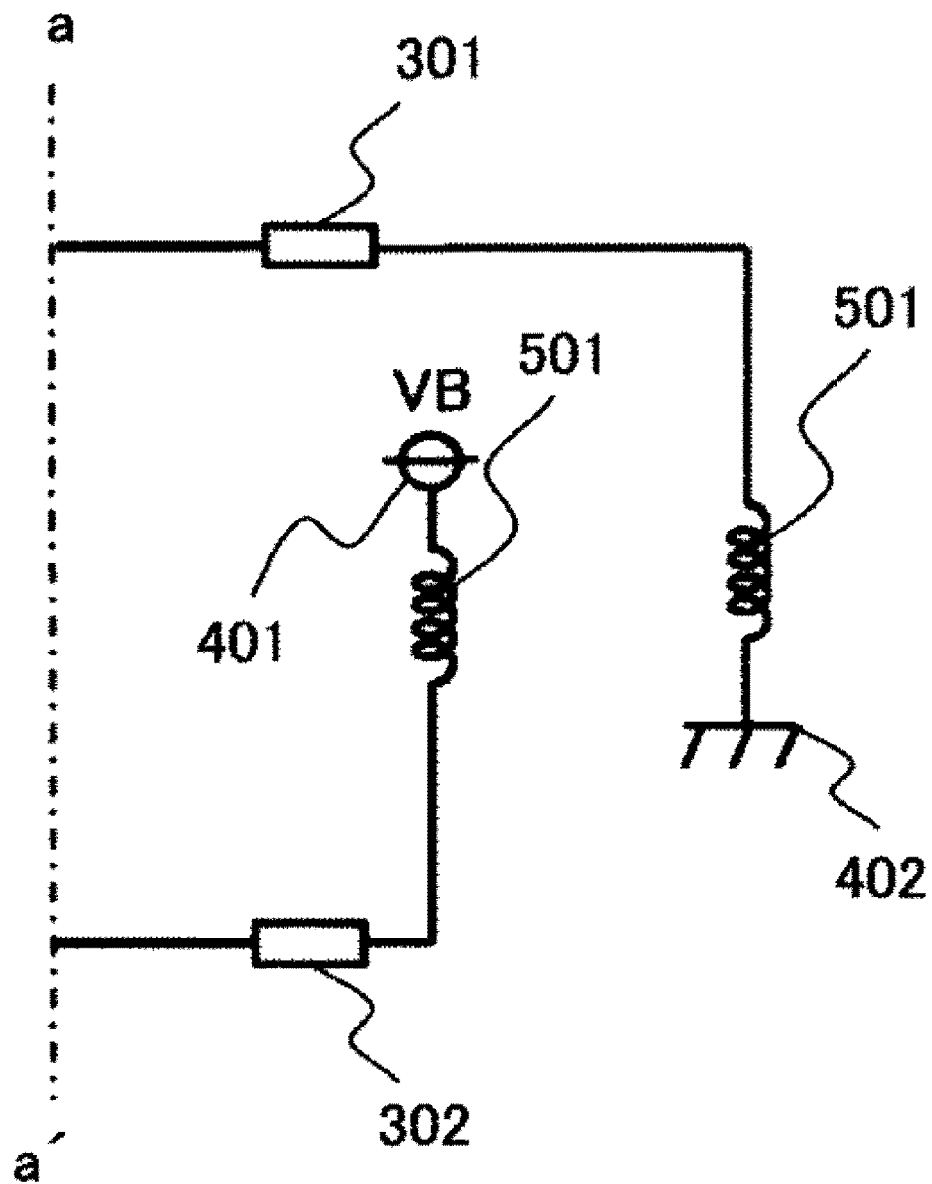
FIG. 1D is a diagram illustrating connection of the loads for both of the LSD and HSD.

In FIGS. 1B and 1C, the examples of single application of the LSD and the HSD are illustrated, but both of the LSD and the HSD may be applied as illustrated in FIG. 1D. In FIG. 1D, one end of the load 501 for an HSD (first load) is connected to the connector terminal 301 (first terminal), and one end of the load 501 for an LSD (second load) is connected to the connector terminal 302 (second terminal). The control element 101 always turns off the switching element 104 (third switching element) on the current return path by using the control signal line 202. In addition, the control element 101 causes the load 501 for HSD connected to the connector terminal 301 to drive by switching of the power-supply-side switching element 102 (first switching element) by using the control signal line 201 so that switching of the ground-side switching element 106 (second switching element) through the control signal line 203 drives the load 501 for an LSD connected to the connector terminal 302 by.

As described above, according to the present embodiment, a single circuit configuration is switchably used as the LCC, the LSD, the HSD, and the LSD and the HSD, depending on a load to be connected and control of switching. That is, the functions of the LCC, the HSD, and the LSD are switched depending on a load to be connected.

In other words, the same interface circuit is employed to selectively use the functions of the LCC, the HSD, and the LSD with software. Since it is unnecessary to manufacture an electronic control unit for each of the LCC, the HSD, and the LSD, the man-hours for management is not increased and further the number of connector terminals is not increased.

Figure 4:
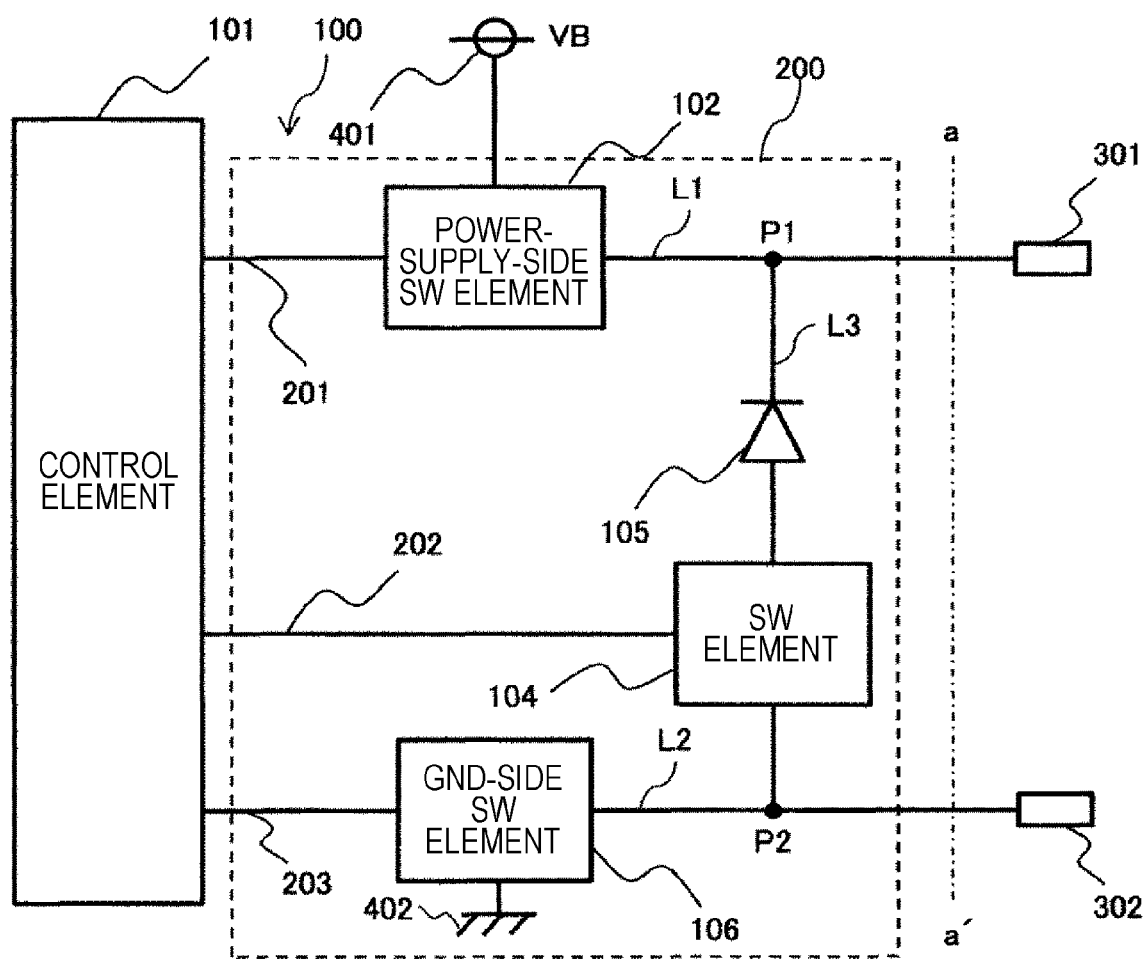
FIG. 4 is a diagram illustrating a modification of FIG. 1 in which the positions of the diode and the switching element in the current return path are interchanged with each other.

As illustrated in FIG. 4, the positions of the switching element 104 and the freewheeling diode 105 on the current return path may be interchanged with each other. Thus, the same effect can be obtained.

Second Embodiment

Figure 2:
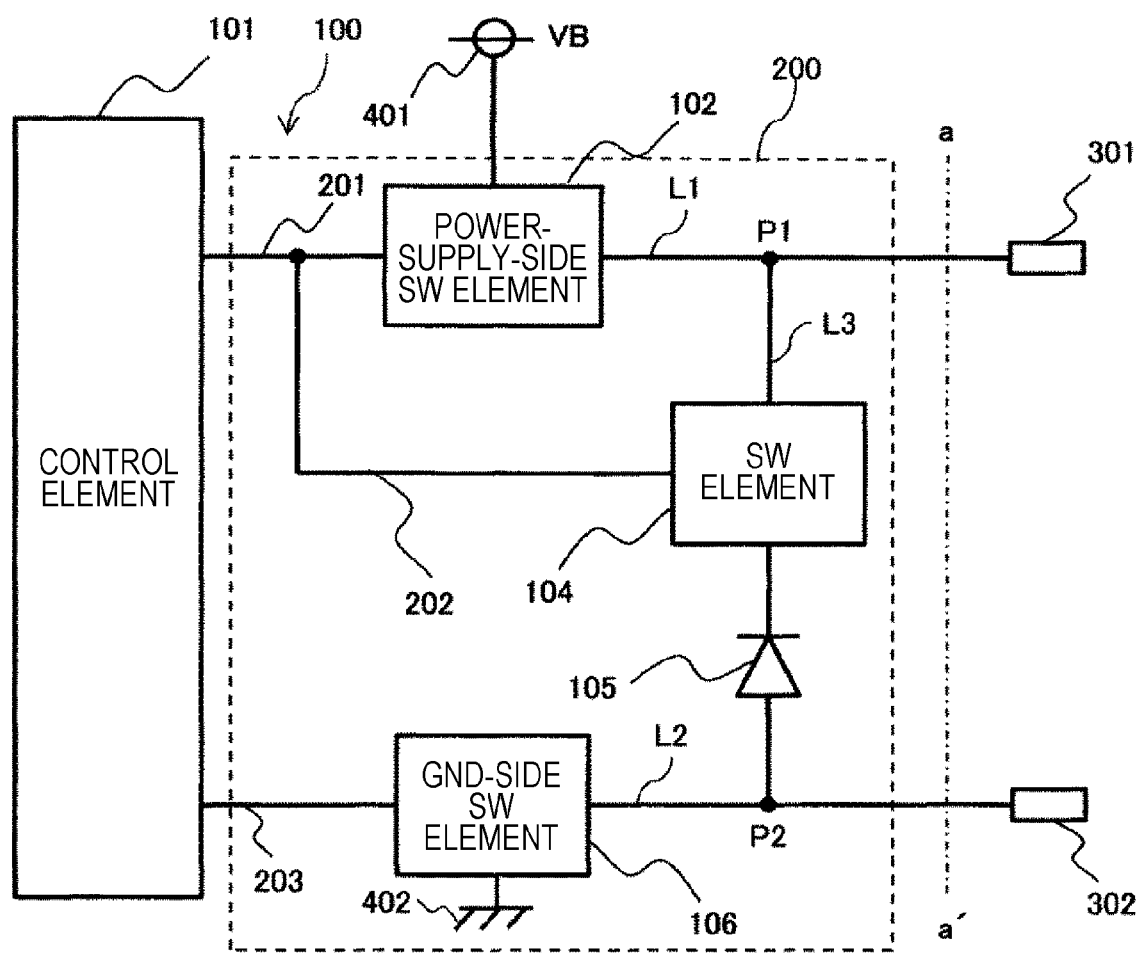
FIG. 2 is a schematic diagram of an electronic control unit including an interface circuit according to a second embodiment of the present invention.

Next, a second embodiment of the present invention will be described with reference to FIG. 2. FIG. 2 is a diagram illustrating a method of reducing the number of control signal lines from the control element 101 by using the same logic control signal.

In FIG. 2, the control signal line 201 and the control signal line 202 have the same signal line, and the power-supply-side switching element 102 and the switching element 104 on the current return path are controlled in accordance with the same logic. That is, the control signal line 202 (third control line) is connected to the control signal line 201 (first control line). This configuration enables application of combination use of the LCC and the LSD in which the ground-side switching element 106 is caused to perform switching by using the control signal line 203.

Note that the control signal line 201 (first control line) is connected to the power-supply-side switching element 102 (first switching element), the control signal line 203 (second control line) is connected to the ground-side switching element 106 (second switching element), and the control signal line 202 (third control line) is connected to the switching element 104 (third switching element).

As illustrated in FIG. 1A, when the interface circuit is used as the LCC, the inductive load 501a is connected and the power-supply-side switching element 102 and the switching element 104 on the current return path are always turned on by using the control signal line 201 and the control signal line 202.

As illustrated in FIG. 1B, when the interface circuit is used as the LSD, the load 501 is connected and the power-supply-side switching element 102 and the switching element 104 on the current return path are always turned off by using the control signal line 201 and the control signal line 202.

As described above, according to the present embodiment, a single circuit configuration is switchably used as the LCC and the LSD. Furthermore, the control signal line 202 for the switching element 104 on the current return path and the control signal line 201 have the same signal line, and it is possible to remove the control signal line 202 extending from the control element 101.

Figure 5:
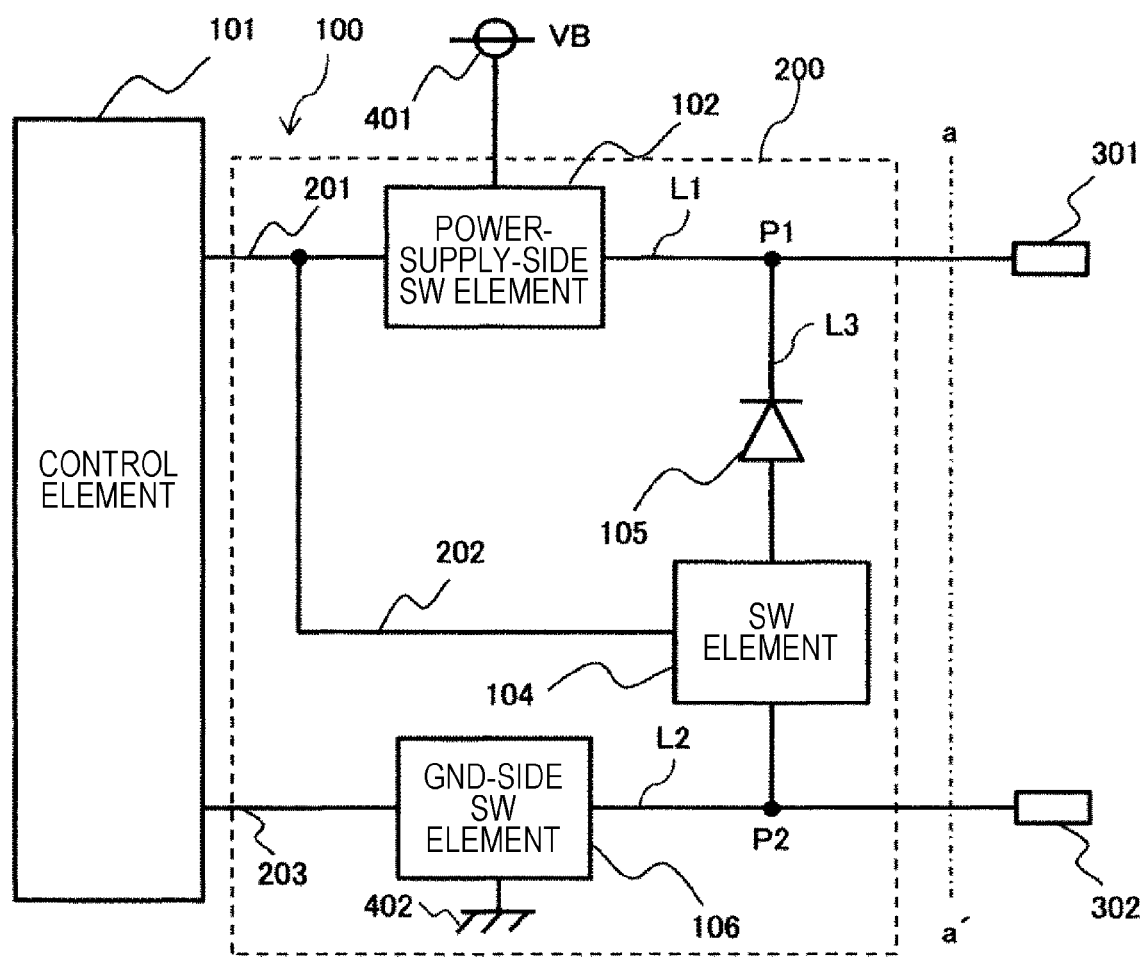
FIG. 5 is a diagram illustrating a modification of FIG. 2 in which the positions of the diode and the switching element in the current return path are interchanged with each other.

As illustrated in FIG. 5, the positions of the switching element 104 and the freewheeling diode 105 on the current return path may be interchanged with each other. However, to control turning on/off of the switching element 104 on the current return path with a suitable voltage, a voltage conversion circuit, not illustrated, is required.

(Modification)

Figure 3:
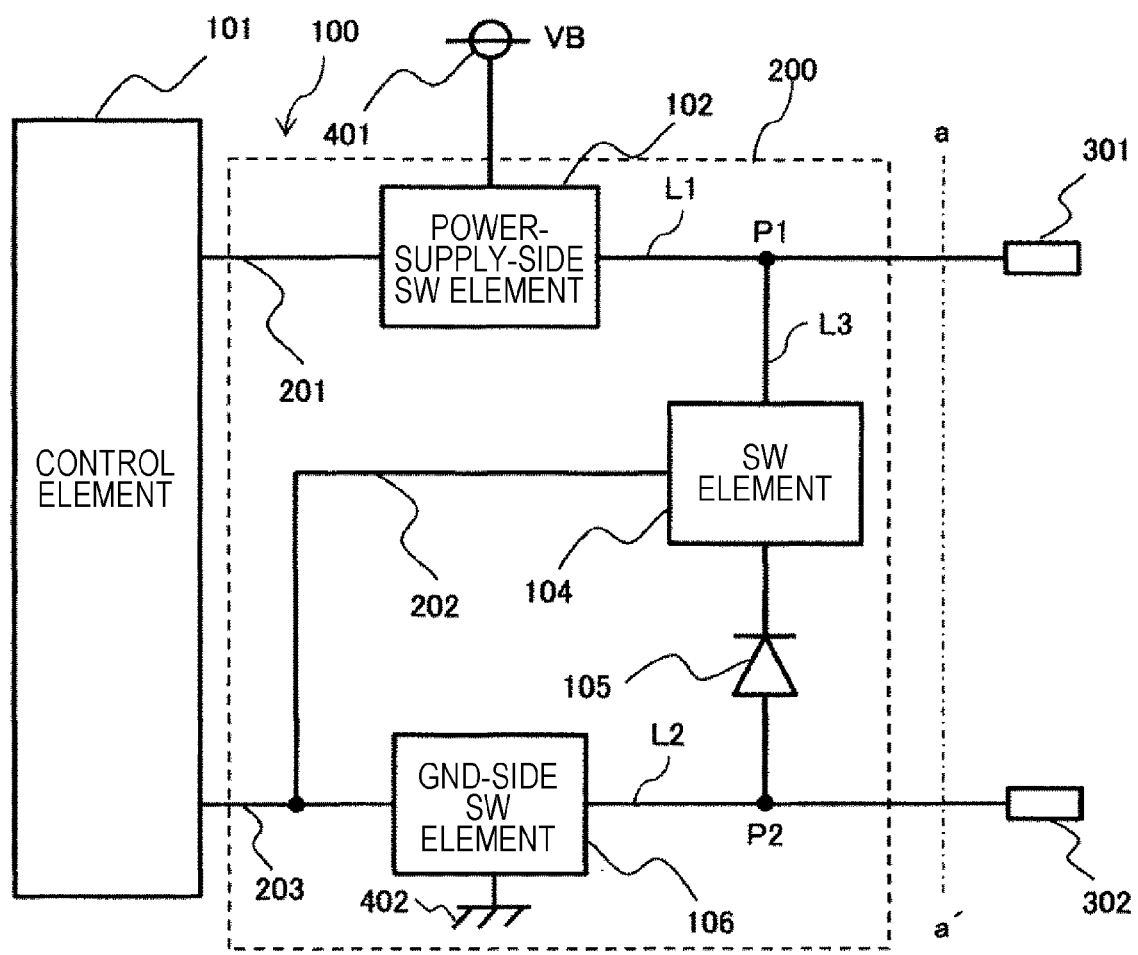
FIG. 3 is a schematic diagram of an electronic control unit including an interface circuit according to a modification of the second embodiment of the present invention.

Next, a modification of the second embodiment of the present invention will be described with reference to FIG. 3. FIG. 3 is a diagram illustrating another method of reducing the number of control signal lines from the control element 101 by using the same logic control signal.

In FIG. 3, the control signal line 202 and the control signal line 203 have the same signal line, and the ground-side switching element 106 and the switching element 104 on the current return path are controlled in accordance with the same logic. That is, the control signal line 202 (third control line) is connected to the control signal line 203 (second control line).

This configuration is different from that of FIG. 2 in that a voltage conversion circuit, not illustrated, is required to control turning on/off the switching element 104 on the current return path with a suitable voltage. This configuration enables application of combination use of the LCC and the HSD in which the power-supply-side switching element 102 is caused to perform switching by using the control signal line 201.

As illustrated in FIG. 1A, when the interface circuit is used as the LCC, the inductive load 501a is connected and the ground-side switching element 106 and the switching element 104 on the current return path are always turned on by using the control signal line 203 and the control signal line 202.

As illustrated in FIG. 1C, when the interface circuit is used as the HSD, the load 501 is connected and the ground-side switching element 106 and the switching element 104 on the current return path are always turned off by using the control signal line 203 and the control signal line 202.

As described above, according to the present modification, a single circuit configuration is switchably used as the LCC and the HSD. Furthermore, the control signal line 202 for the switching element 104 on the current return path and the control signal line 203 have the same signal line, and it is possible to remove the control signal line 202 extending from the control element 101.

Figure 6:
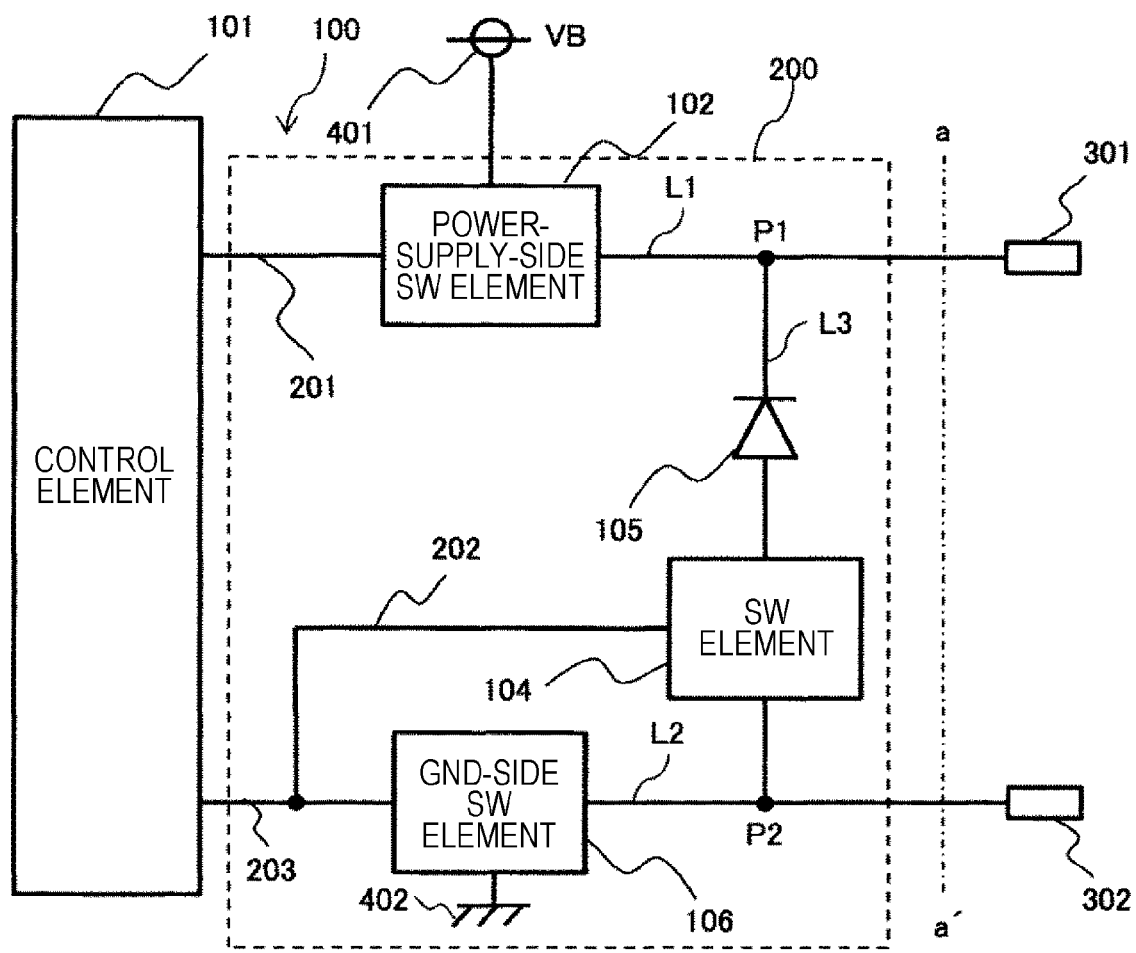
FIG. 6 is a diagram illustrating a modification of FIG. 3 in which the positions of the diode and the switching element in the current return path are interchanged with each other.

As illustrated in FIG. 6, the positions of the switching element 104 and the freewheeling diode 105 on the current return path may be interchanged with each other. However, to control turning on/off of the switching element 104 on the current return path with a suitable voltage, a voltage conversion circuit, not illustrated, is required.

Third Embodiment

Figure 7:
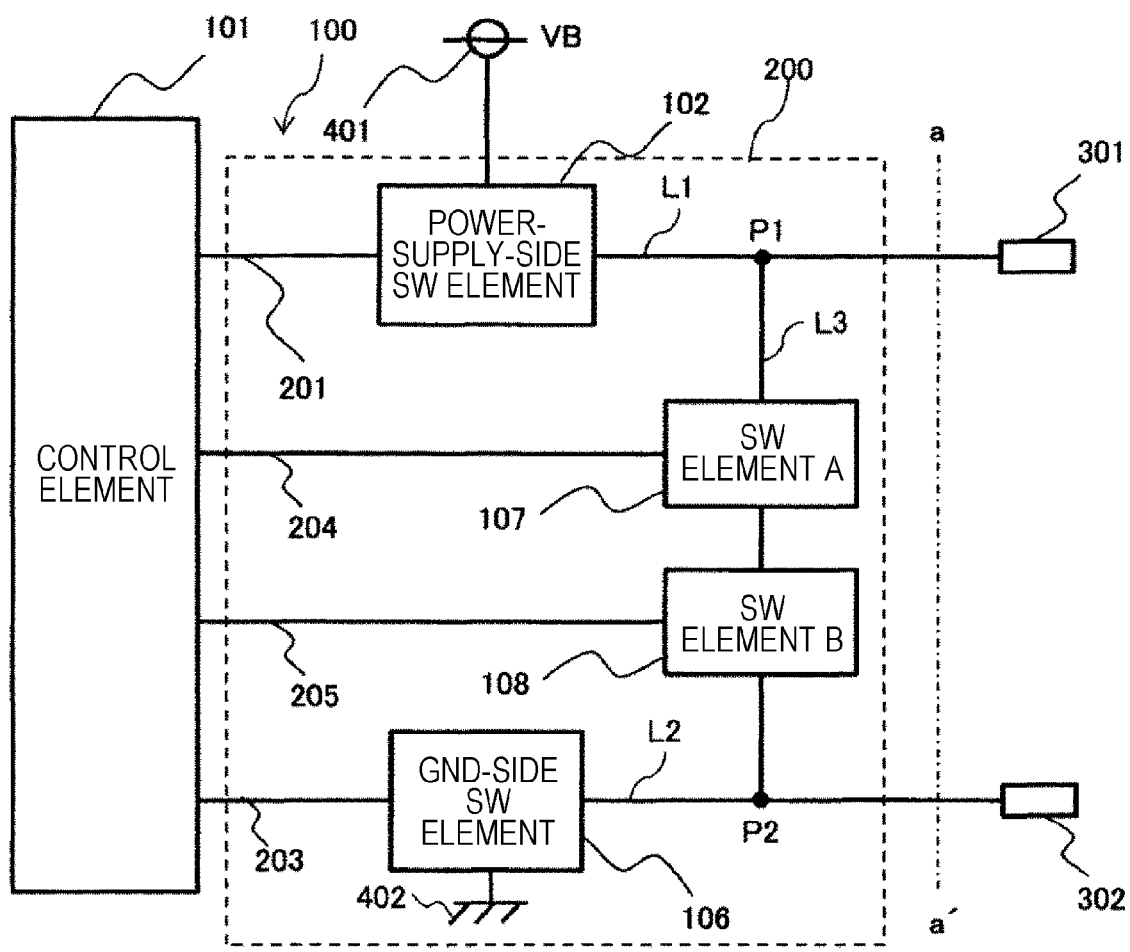
FIG. 7 is a schematic diagram of an electronic control unit including an interface circuit according to a third embodiment of the present invention.

Next, a third embodiment of the present invention will be described with reference to FIG. 7. FIG. 7 is a diagram illustrating an embodiment where the switching element 104 and the freewheeling diode 105 which are on the current return path in the first embodiment are replaced with a switching element A 107 and a switching element B 108, respectively.

In other words, one (fourth switching element) of the switching element A 107 and the switching element B 108 functions as a rectifier element.

In this configuration, since the switching element A 107 and the switching element B 108 are turned on/off at any time by using a control signal line 204 and a control signal line 205, power loss caused by the forward voltage of the diode provided on the current return path in the first embodiment can be reduced.

According to the present embodiment, a single circuit configuration is switchably used as the LCC, the LSD, and the HSD, depending on a load to be connected and control of switching. In addition, it is possible to reduce power loss in the current return path.

Note that the present invention is not limited to the above embodiments, and may include various modifications. For example, the above embodiments are described in detail for ease of understanding the present invention, and therefore, the present invention is not necessarily limited to a configuration including all of the configurations described above. Furthermore, part of a configuration of an embodiment can be replaced with a configuration of another embodiment, and a configuration of an embodiment can be added to a configuration of another embodiment. Still furthermore, for part of the configurations of the respective embodiments, additions, eliminations, or substitutions of another configuration may be made.

The embodiments of the present invention may include the following aspects.

(1) An electronic control unit including a power-supply-side switching element which supplies current from a power supply to a load, a ground-side switching element which cause current to flow from the load to a ground, a current return path which causes a return current to flow from the load to the upstream side of the load, and a current return switching element disposed in the current return path to switch conduction and block of a path.

(2) The electronic control unit according to (1), in which the current return switching element disposed in the current return path includes an element which limits a direction of the current return path and a switching element which switches conduction and block of a path.

(3) The electronic control unit according to (1), in which the current return switching element disposed in the current return path includes two switching elements which switch between conduction and block of the current return path.

(4) The electronic control unit according to (1) to (3), further including a linear current control circuit which, for a load having both ends connected to the power-supply-side switching element and the ground-side switching element, always turns on the ground-side switching element when controlling switching of the power-supply-side switching element, always turns on the power-supply-side switching element when controlling switching of the ground side switching element, and always turns on the current return switching element disposed in the current return path, for conduction of the current return path.

(5) The electronic control unit according to (1) to (3), further including an on/off control circuit which, for a load connected to either the power-supply-side switching element or the ground-side switching element, always turns off the ground-side switching element to which no load is connected when controlling switching of the power-supply-side switching element to which a load is connected, always turns off the power-supply-side switching element to which no load is connected when controlling switching of the ground-side switching element to which a load is connected, and always turns off the current return switching element disposed in the current return path, for block of the current return path.

(6) The electronic control unit according to (1) to (5), further including a control element which switches a linear current control circuit and an on/off control circuit so that controlling switching of the power-supply-side switching element or the ground-side switching element and turning on/off a current return switching element disposed in the current return path are performed for conduction and block of the current return path, and the return current is used to drive a load depending on connection of the load.

(7) The electronic control unit according to (1) to (6), in which, for the power-supply-side switching element or the ground-side switching element and a current return switching element disposed in the current return path, conduction and block of the current return path are performed by turning on/off a current return switching element disposed in the current return path by the same logic as that of the power-supply-side switching element or the ground-side switching element on which control of switching is not performed, and a linear current control circuit and an on/off control circuit are switched.

(8) The electronic control unit according to (1) to (7), in which the power-supply-side switching element or the ground-side switching element are connected to a control terminal and an output terminal of the current return switching element and then turned on/off in response to a control signal of the same voltage, for conduction and block of the current return path.

According to the above embodiments (1) to (8), it is possible to use interface circuits for the LCC as linear current control and for the HSD or the LSD as on/off control, and any of the interface circuits is selected by software to be used as a drive circuit.

In addition, turning on/off of a switching element in a current return path in accordance with the same logic as that of a switching element on the opposite side from a switching element on which switching control is performed in response to the same control signal.

Furthermore, the power-supply-side switching element or the ground-side switching element and the switching element in the current return path which include an N-channel or P-channel MOSFET are turned on/off in response to a control signal of the same potential.

REFERENCE SIGNS LIST 100 electronic control unit
101 control element for controlling various switching elements
102 power-supply-side switching element
104 switching element on current return path
105 freewheeling diode
106 ground-side switching element
107 switching element A on current return path
108 switching element B on current return path
200 interface circuit
201 control signal line for power-supply-side switching element 102
202 control signal line for switching element 104 on current return path
203 control signal line for ground-side switching element 106
204 control signal line for switching element A 107
205 control signal line for switching element B 108
301 connector terminal
302 connector terminal
401 power supply (battery)
402 ground
501a inductive load
501 load

The invention claimed is:
1. An electronic control unit comprising:
a first switch which is provided in a first path between a power supply and a first terminal and configured to switch between conduction and interruption of a current flowing from the power supply to the first terminal;
a second switch which is provided in a second path between a ground and a second terminal and configured to switch between conduction and interruption of a current flowing from the second terminal to the ground;
a rectifier which is provided in a third path connected to a first connection point between the first switch and the first terminal and a second connection point between the second switch and the second terminal, the third path branched from the first path and the second path;
a third switch which is provided in the third path,
wherein the first terminal and the second terminal are terminals configured to connect to a load, and
a microcomputer configured to:
keep the second switch and the third switch off and perform switching of the first switch when a load has a first end connected only to the first terminal, and
keep the first switch and the third switch off while performing switching of the second switch when the first end of the load is connected only to the second terminal.

2. An electronic control unit comprising:
a first switch which is provided in a first path between a power supply and a first terminal and configured to switch between conduction and interruption of a current flowing from the power supply to the first terminal;
a second switch which is provided in a second path between a ground and a second terminal and configured to switch between conduction and interruption of a current flowing from the second terminal to the ground;
a rectifier which is provided in a third path connected to a first connection point between the first switch and the first terminal and a second connection point between the second switch and the second terminal;
a third switch which is provided in the third path,
wherein the first terminal and the second terminal are terminals configured to connect to a load; and
a microcomputer which, when an inductive load has a first end connected to the first terminal and a second end connected to the second terminal, is configured to keep the third switch on, and keep either the first switch or the second switch on while performing switching of the other of the first switch or the second switch.

3. The electronic control unit according to claim 2, wherein the microcomputer is configured to keep the second switch and the third switch off and perform switching of the first switch, when a load has a first end connected only to the first terminal, and
keep the first switch and the third switch off while performing switching of the second switch, when the first end of the load is connected only to the second terminal.

4. An electronic control unit comprising:
a first switch which is provided in a first path between a power supply and a first terminal and configured to switch between conduction and interruption of a current flowing from the power supply to the first terminal;
a second switch which is provided in a second path between a ground and a second terminal and configured to switch between conduction and interruption of a current flowing from the second terminal to the ground;
a rectifier which is provided in a third path connected to a first connection point between the first switch and the first terminal and a second connection point between the second switch and the second terminal, the third path branched from the first path and the second path;

a third switch which is provided in the third path, the first terminal and the second terminal being terminals configured to connect to a load, a microcomputer configured to:
keep the second switch and the third switch off and perform switching of the first switch, when the load has a first end connected only to the first terminal, and keep the first switch and the third switch off while performing switching of the second switch, when the first end of the load is connected only to the second terminal;

a first control line which is connected to the first switch;

a second control line which is connected to the second switch; and a third control line which is connected to the third switch, wherein the third control line is connected to the first control line or the second control line, and wherein the third control line is the same signal line as the first control line or the second control line.

5. The electronic control unit according to claim 1, wherein when the first end of the load is connected only to the first terminal, a second end of the load is connected to ground; and when the first end of the load is connected only to the second terminal, a second end of the load is connected to the power supply.

6. The electronic control unit according to claim 1, wherein the microcomputer is further configured to, when a non-inductive load has a first end connected to the first terminal and a second end connected to the second terminal, keep the third switch and either the first switch or the second switch off while performing switching of the other of the first switch or the second switch.

7. The electronic control unit according to claim 3, wherein when the first end of the load is connected only to the first terminal, a second end of the load is connected to ground; and when the first end of the load is connected only to the second terminal, a second end of the load is connected to the power supply.

8. The electronic control unit according to claim 2, wherein the microcomputer is further configured to, when a non-inductive load has a first end connected to the first terminal and a second end connected to the second terminal, keep the third switch and either the first switch or the second switch off while performing switching of the other of the first switch or the second switch.

9. The electronic control unit according to claim 4, wherein when the first end of the load is connected only to the first terminal, a second end of the load is connected to ground; and when the first end of the load is connected only to the second terminal, a second end of the load is connected to the power supply.

10. The electronic control unit according to claim 4, wherein the microcomputer is further configured to, when the load is a non-inductive load and the first end is connected to the first terminal and a second end of the load is connected to the second terminal, keep the third switch and either the first switch or the second switch off while performing switching of the other of the first switch or the second switch.

* * * * *